United States Patent
Abdelhalim et al.

(10) Patent No.: US 10,951,250 B1
(45) Date of Patent: Mar. 16, 2021

(54) HIGH-SPEED DC SHIFTING PREDRIVERS WITH LOW ISI

(71) Applicants: Karim Vincent Abdelhalim, Newport Coast, CA (US); Michael Q. Le, Laguna Niguel, CA (US)

(72) Inventors: Karim Vincent Abdelhalim, Newport Coast, CA (US); Michael Q. Le, Laguna Niguel, CA (US)

(73) Assignee: SITRUS TECHNOLOGY CORPORATION, Shanghai (CN)

( * ) Notice: Subject to any disclaimer, the term of this patent is extended or adjusted under 35 U.S.C. 154(b) by 0 days.

(21) Appl. No.: 16/855,945

(22) Filed: Apr. 22, 2020

Related U.S. Application Data (60) Provisional application No. 62/854,219, filed on May 29, 2019.

(51) Int. Cl.
*H04K 1/02* (2006.01)
*H04B 1/04* (2006.01)
*H04L 25/03* (2006.01)
*H03K 5/003* (2006.01)

(52) U.S. Cl.
CPC ........... *H04B 1/0475* (2013.01); *H03K 5/003* (2013.01); *H04L 25/03343* (2013.01)

(58) Field of Classification Search
CPC . H04B 1/0475; H03K 5/003; H04L 25/03343
USPC ................................ 375/296, 295, 219, 316
See application file for complete search history.

(56) References Cited

U.S. PATENT DOCUMENTS 7,999,523 B1 * 8/2011 Caffee .............. H03K 19/00361
                                                        323/271
2017/0302267 A1 * 10/2017 Luo .................... H04L 25/03133

\* cited by examiner

*Primary Examiner* — Zewdu A Kassa
(74) *Attorney, Agent, or Firm* — Burdick Patents, P.A.; Sean D. Burdick (57) ABSTRACT

A DC-shifting predriver has an input port configured for coupling to a serial data stream, an inverting output amplifier having an feedback node and an output port configured for coupling to a transistor at the input to a high-speed DAC or TX driver, and a capacitor AC-coupled between the input port and the feedback node. A weak feedback inverter having structure similar to, but less drive strength than the inverting output amplifier is coupled between the output port and the feedback node to act as a positive feedback latch. The predriver provides a DC shift up to 3V with high reliability and minimal intersymbol interference for data rates from 10 GS/s to 28 GS/s or higher. The predriver may provide multiple input ports implemented as a predriver array in an M-bit system, and the output amplifier may consist of N stages.

20 Claims, 13 Drawing Sheets

HIGH-SPEED DC SHIFTING PREDRIVERS WITH LOW ISI

RELATED APPLICATIONS

This application is related to and claims priority to U.S. Provisional Application 62/854,219 that was filed May 29, 2019 and which is fully incorporated herein by reference.

BACKGROUND OF THE INVENTION

Field of the Invention

The present invention relates generally to digital communication systems, more specifically to an apparatus and method for implementing a high-speed DC shifting predriver for a transmitter driver or a digital-to-analog converter, and most specifically to a high-speed DC shifting predriver array customized for PAM4 modulation that has low ISI and that can be integrated on a CMOS communication chip.

Description of Related Art

Figure 1:
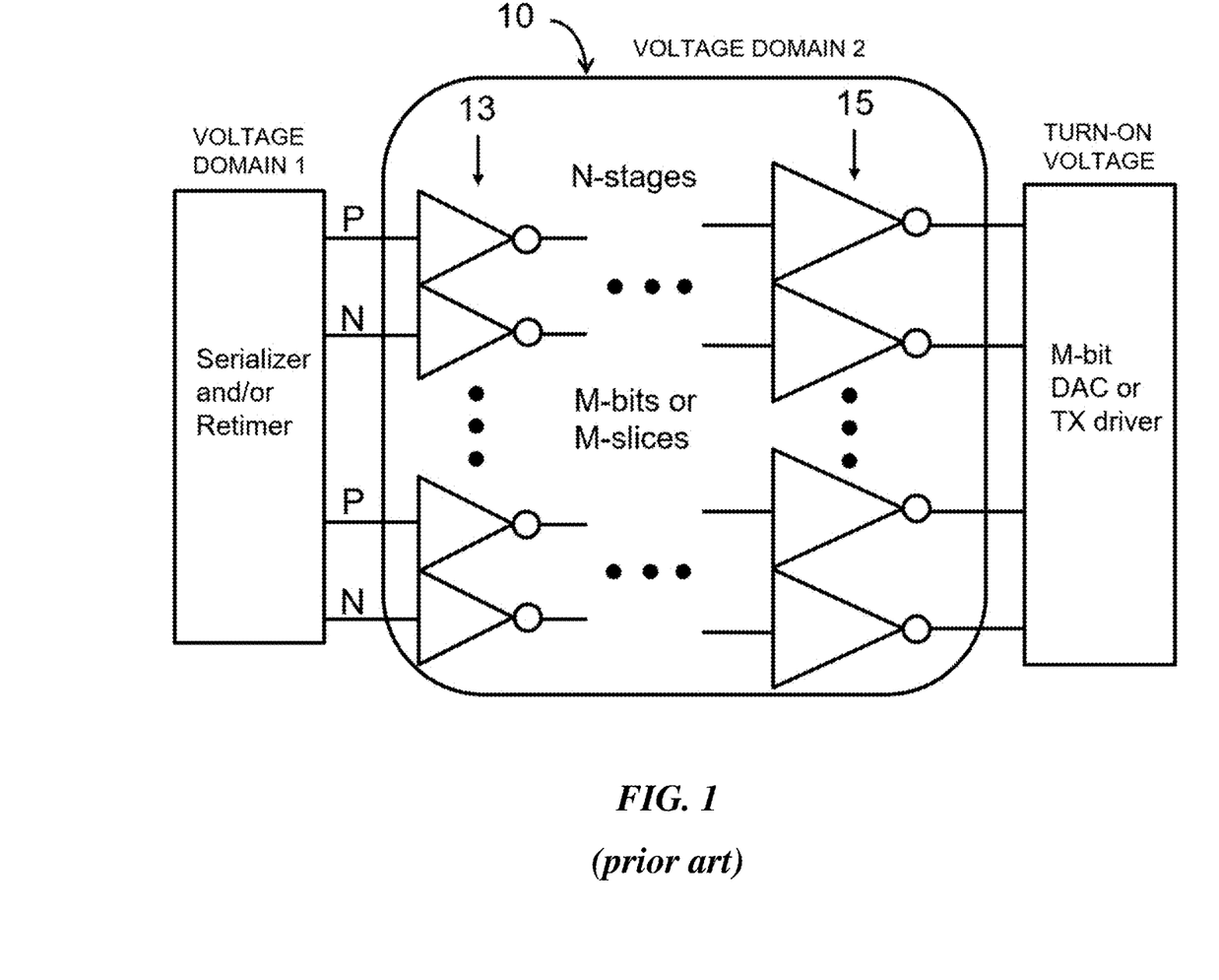
FIG. 1 is a block diagram of a circuit known in the prior art for implementing a predriver for a high-speed TX driver or DAC.

Predrivers for a high-speed transmitter (TX) driver or digital-to-analog converter (DAC) and are generally used to buffer the high-speed digital data between a serializer, such as a 2:1 MUX or retimer, and the larger input capacitance of the TX driver or DAC input. Predriver array 10 shown in FIG. 1 is typical of this type. Predriver 10 may consist of a number of cascaded inverters (13, 15) of increasing size that form N-stages of amplification. Each stage is often implemented differentially with both a "p" side and an "n" side.

A relatively large input capacitance of the TX driver or DAC input is provided to enable its transistors to deliver greater than 20 mA of current into a 50-ohm termination. The input devices in the predriver are often broken up into an array of M-bits for a DAC, or M slices for a TX driver. Generally, the serializer and/or retimer will use one conventional digital voltage domain ("voltage domain 1"), for example Vss=0V and Vdd=0.9V for CMOS logic. Often, the voltage level required to turn on the input device ("turn-on voltage") can be the same, or the turn-on voltage can often be slightly larger, such as Vss=0.15V, Vdd=1.5V. Such a larger turn-on voltage ("voltage domain 2") can be achieved through use of additional low dropout (LDO) regulators, as disclosed, for example in A. Nazemi, ISSCC 2015. In other cases, the required DC shift can be even higher, for example Vss=0.6V, Vdd=1.5V which can achieved through a current mode logic (CML) buffer stage following the CMOS logic, as disclosed in T. Ali, ISSCC 2019. It is noted that the CML buffer stage only works for DAC or TX drivers that have low swing (i.e. relatively small input capacitance) due to bandwidth of the RC circuit.

A problem arises, however, when using a high-speed (>10 GHz) DAC or TX driver that requires a very high DC shift, e.g. 2.1V or 3.0V at voltage domain 2, to turn on the input device at very high data rates. This situation can arise, for example, when connecting a PMOS DAC or TX driver to the high supply voltage. Here, the CML approach may be unsatisfactory as it would require high power dissipation due to the current draw from the 3.0V source, and in addition, RC values may become limiting factors when using large DAC or TX drivers.

Figure 2:
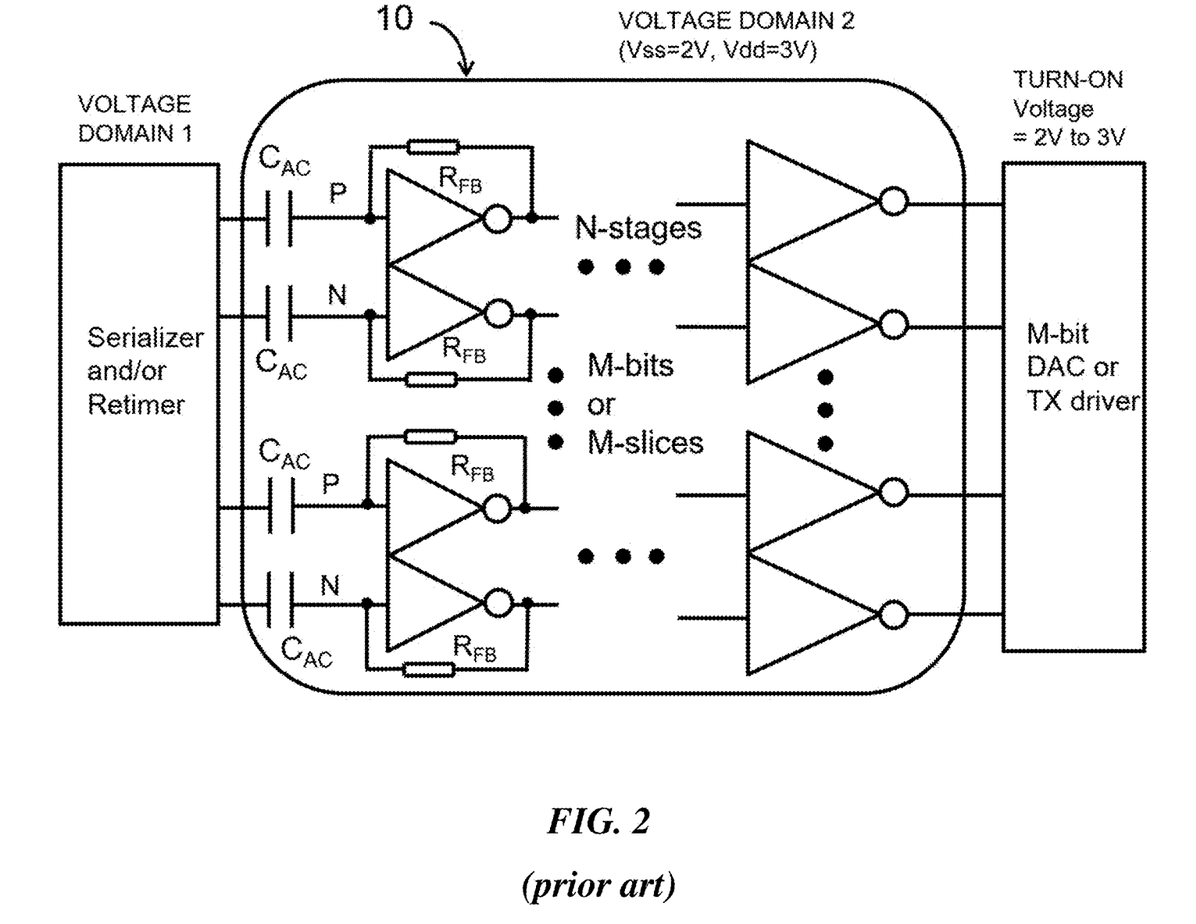
FIG. 2 is a block diagram of another circuit known in the prior art for implementing a predriver for a high-speed TX driver or DAC, having AC-coupled buffers at the first stage of the predriver array.

Another approach, as illustrated in FIG. 2, is to place AC-coupled buffers at the first stage of the predriver array 10, which requires an AC-coupling capacitor ($C_{AC}$) and a feedback resistor ($R_{FB}$) to set a high-pole as $1/(2\pi R_{FB} C_{AC})$. In this example, voltage domain 2 would use Vss=2V and Vdd=3V and a deep n-well for isolation of the predriver Vss to the substrate GND. The use of AC-coupled buffers in this manner, however, only introduces further problems. Chief among these is that the high-pass RC pole must be set very low to prevent intersymbol interference (ISI) due to the frequency content of the incoming random data stream. For example, a large number of 1's or 0's would tend to show significant ISI if the RC pole is not set sufficiently low.

Figure 3:
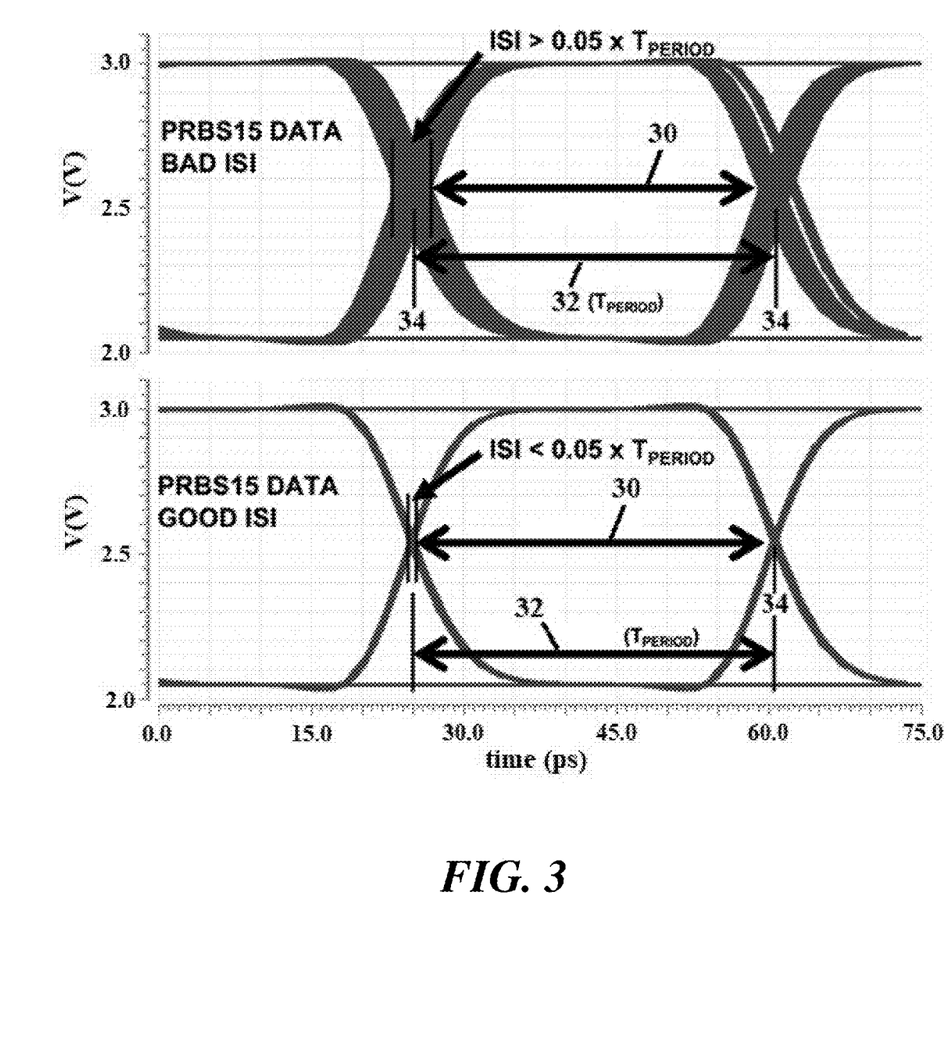
FIG. 3 is an exemplary eye diagram illustrating how ISI is calculated.

The acceptability of ISI may be evaluated using eye diagrams. To illustrate, FIG. 3 provides exemplary eye diagrams having characteristic superimposed curves of voltage versus time resulting from transmission of a test signal. In this example the test signal is the pseudorandom binary sequence PRBS15. An instance of bad ISI is shown in the upper diagram, and an instance of good ISI is shown in the lower diagram. For best bit-error-rate (BER) performance, it is important to ensure the eye width 30 is maximized. The eye width 30 can be defined as widest the horizontal opening in the eye diagram. In the ideal case, the eye width 30 is equivalent to the data period 32 of the signal (Tperiod). With ISI present, the eye width 30 decreases from its ideal case to the time span between two consecutive cross-points 34 of the resultant eye. Thus, the quantity of the ISI can be expressed by the ratio ISI=(Tperiod−EW)/Tperiod), where EW denotes the measured eye width 30. As illustrated in FIG. 3, the upper eye diagram shows an example of bad ISI, where the ISI is greater than 5% of Tperiod. In contrast, the lower eye diagram in FIG. 3 shows an example of good ISI, where the ISI is less than 5% of Tperiod.

Figure 4:
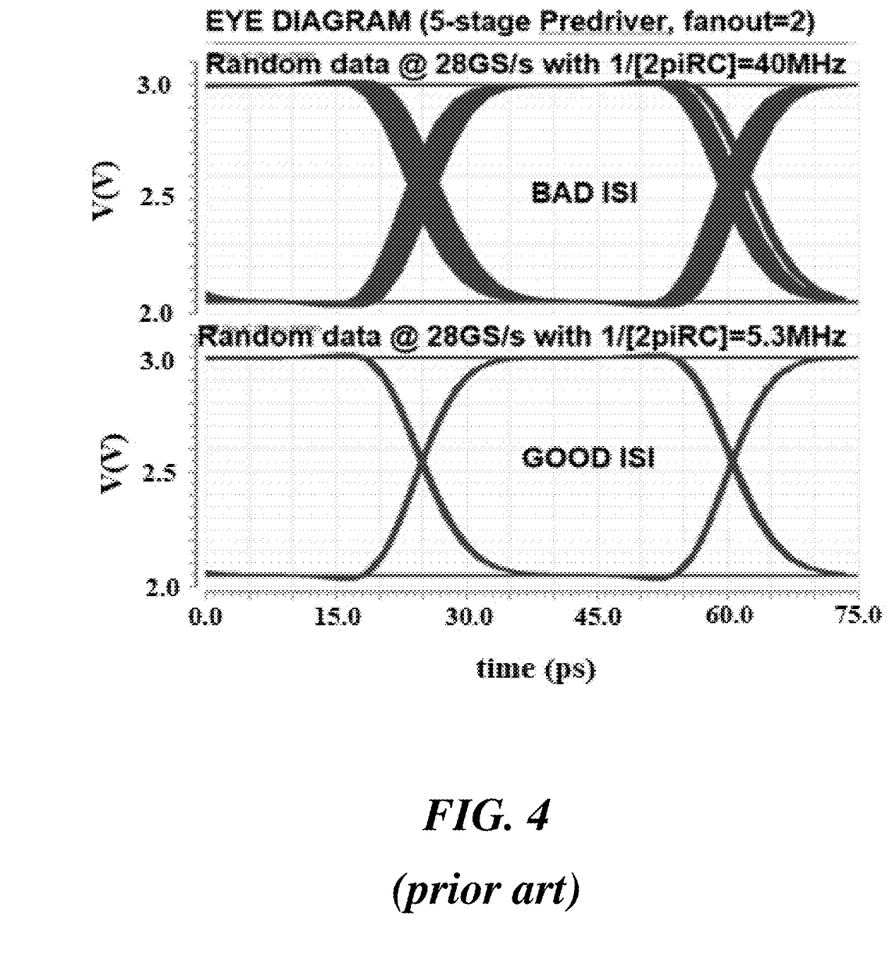
FIG. 4 is an eye diagram showing characteristic ISI curves for an output waveform when random data is input to a prior art predriver at 28 GS/s with poles at 5.3 MHz and 40 MHz.
Figure 5:
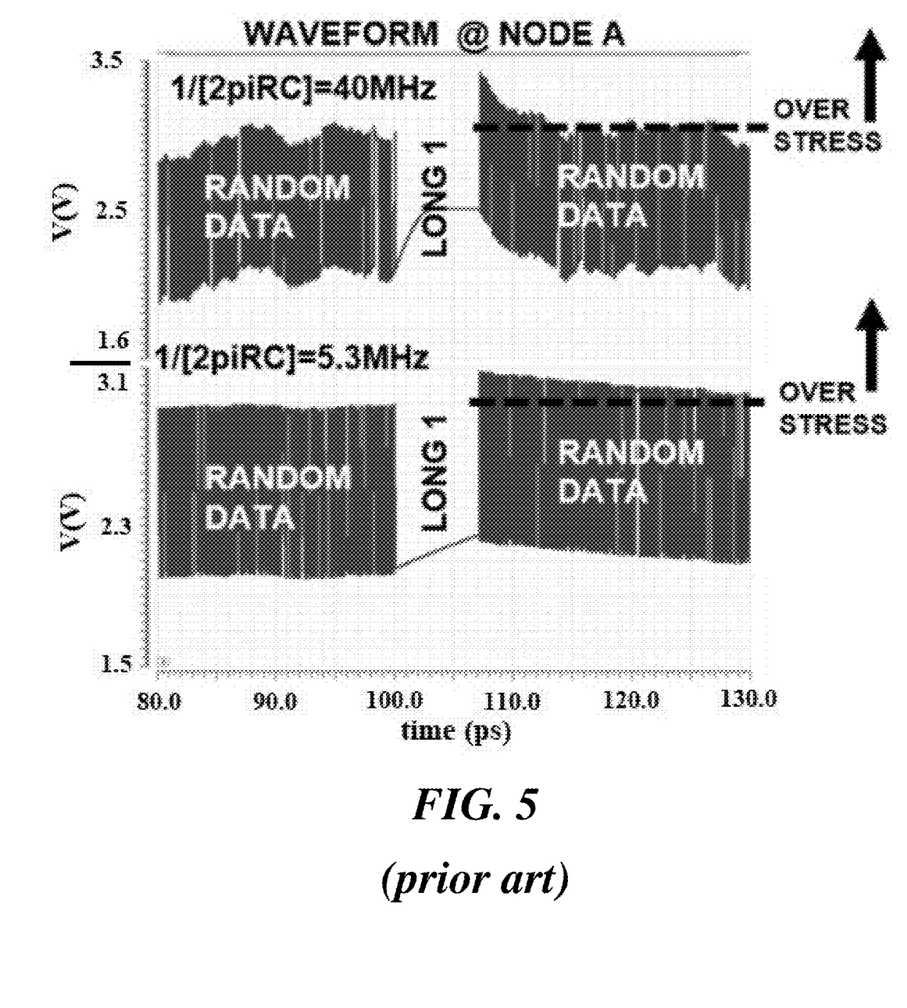
FIG. 5 is a graph showing comparative plots of voltage waveforms at Node A of a circuit known in the prior art for implementing a predriver for a high-speed TX driver or DAC.
Figure 6:
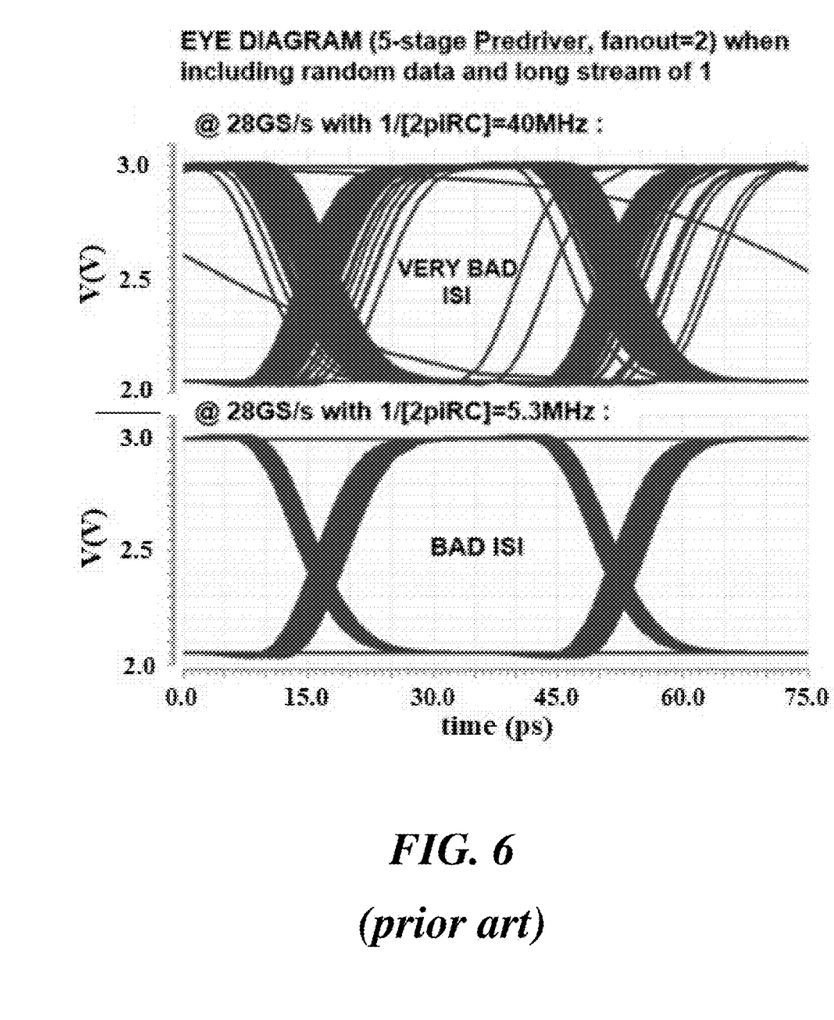
FIG. 6 is an eye diagram showing characteristic ISI curves, in a prior art 5-stage predriver, for an output voltage waveform at 28 GS/s with poles at 5.3 MHz and 40 MHz, given random input followed by a long stream of 1's.

FIG. 4 shows eye diagrams for the circuit of FIG. 2, that result from presence of the high-pass pole receiving both 40 MHz and 5.3 MHz input signals with 28 GS/s random data. At 40 MHz, the circuit exhibits bad ISI, although at 5.3 MHz the circuit exhibits good ISI. FIGS. 5 and 6, however, show poor performance of this circuit in response to a test signal consisting of a repeating "1" followed by random data transmission. FIG. 5 shows that the high-pass pole at both 40 MHz and 5.3 MHz exhibits reliability and overstress issues. FIG. 6 shows the related eye diagrams, which indicate bad ISI performance in both cases.

Figure 7:
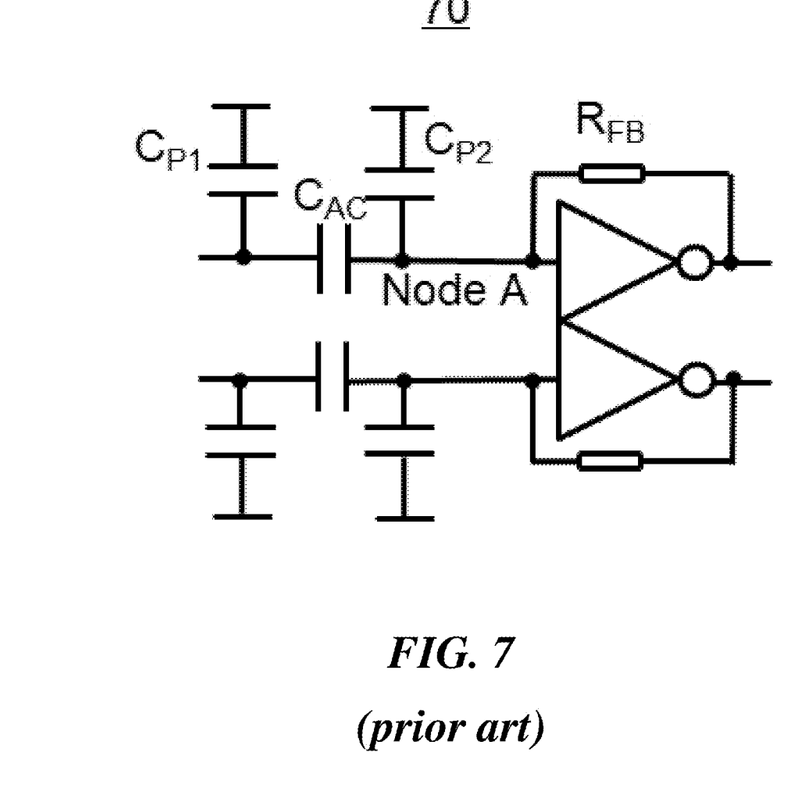
FIG. 7 is a block diagram of a circuit known in the prior art for a predriver for a high-speed TX driver or DAC, with AC-coupled input that introduces parasitic capacitance.

The RC pole could be lowered by increasing $C_{AC'}$ as shown in predriver array 70 in FIG. 7. This technique, however, results in an increase in parasitic capacitance ($C_{P1}$, $C_{P2}$) at the input to the predriver array. The increase in parasitic capacitance $C_{P1}$ undesirably increases the power dissipation of the previous stage, i.e., the 2:1 MUX or retimer. Parasitic capacitance $C_{P2}$ must also be minimized as it creates a voltage divider at which attenuates the input signal at Node A (the input to the inverter), which again results in an increase in ISI.

Another approach is to increase the feedback resistor $R_{FB}$. The disadvantage here is a significant area penalty and consequently speed degradation caused by extra interconnects that are needed when trying to integrate a large predriver array onto a chip. Furthermore, increasing $C_{AC} \times R_{FB}$ results in slow transient start-up times and DC voltage shifts at Node A due to a long stream of 1's or 0's. This results in both ISI and severe reliability issues, for Vgs/Vgd>1.0V.

In sum, known techniques for buffering high-speed data between a serializer and a DAC or TX driver that requires a high DC shift generally fail to achieve low ISI and acceptable levels of reliability. These problems can be more severe when supporting lower data rates, and the techniques tend to be error prone when processing a burst of 1's followed by random data. What is needed is an advancement in predriver design that achieves acceptable ISI for PAM4 modulation and that can be integrated effectively on a CMOS communication chip.

SUMMARY OF THE INVENTION

The present invention overcomes the foregoing problems by apparatus and methods disclosed herein that provide a high-speed DC-shifting predriver design with minimal ISI and high reliability. In general, the invention achieves these objectives by coupling a positive feedback latch across the predriver's inverting output amplifier. The positive feedback latch ensures that the feedback node of the inverting output amplifier is driven strongly as data is being transmitted, thereby minimizing ISI due to random datastreams.

In a fundamental embodiment, a high-speed DC-shifting predriver according to the invention includes an input port configured for coupling to a serial data stream, an inverting output amplifier having a feedback node and having an output port configured for coupling to a transistor, a capacitor AC-coupled between the input port and the feedback node, and a positive feedback latch coupled between the output port and the feedback node. The positive feedback latch is configured with a lower drive strength than the inverting output amplifier, to ensure that the feedback node is always driven strongly as data is being transmitted. In a preferred implementation, the serial data stream is received from a serializer or retimer, the positive feedback latch consists of a weak feedback inverter having a similar structure as that of the inverting output amplifier, and the transistor driven by the inverting output amplifier represents the input for a TX driver or DAC. The inverting output amplifier is configured to DC-shift the voltage received at the input port in the range of [VDDio−VDDcore] to VDDio, for data rates in the range of 10 GS/s to 28 GS/s or higher, while the weak feedback inverter ensures minimal ISI without creating overstress or reliability concerns. Those skilled in the relevant art will recognize that in modern CMOS fabrication processes, VDDio is in the approximate range of 1.8V to 3.3V and VDDcore is in the approximate range of 0.8V to 1.0V.

Another embodiment of the invention is configured with an input port having a plurality of M inputs, where each input is coupled to a corresponding one of M bits output from the serial data stream. In the same embodiment or in a separate embodiment, a predriver according to the invention includes an inverting output amplifier having a plurality of N amplification stages. In these and other embodiments, a predriver of the present invention may be configured to eliminate substantially all overstress responsive to random data input and/or long 1 input transmitted at data rates up to about 56 GS/s. The various embodiments disclosed herein for a high-speed, DC shifting predriver of the present invention may be fabricated as an integrated circuit or as a portion thereof.

Related methods according to the invention are also disclosed. In one such exemplary embodiment, a method for implementing a DC-shifting transistor predriver for reducing intersymbol interference in a serial data stream transmitted at a high data rate includes the following salient steps: providing an inverting output amplifier having a feedback node, and having an output port configured for coupling to the transistor, receiving the serial data stream at the feedback node through an AC-coupling, and coupling a positive feedback latch between the output port and the feedback node. In a preferred implementation, the serial data stream is received from a serializer or retimer, the positive feedback latch consists of a weak feedback inverter having a structure similar to that of the inverting output amplifier, and the transistor represents the input for a TX driver or DAC. Another embodiment includes an additional step for amplifying, by the inverting output amplifier, the serial data stream by an amount from [VDDio−VDDcore] to VDDio, and/or amplifying while maintaining intersymbol interference at less than 5% of the data period. More elaborate methods include any of the foregoing implementations wherein the inverting output amplifier includes a plurality of N amplification stages.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. Dimensions shown are exemplary only. In the drawings, like reference numerals may designate like parts throughout the different views, wherein:

DETAILED DESCRIPTION OF THE INVENTION

The following disclosure presents apparatus and methods of the present invention that achieve a high-speed DC-shifting predriver with high reliability and minimal ISI. The invention employs a weak inverter as a positive feedback latch across the output stage of the predriver to ensure that a serial data stream can be amplified at a high data rate with low risk of overstress to drive an input transistor, e.g. for a DAC or TX driver.

Figure 8:
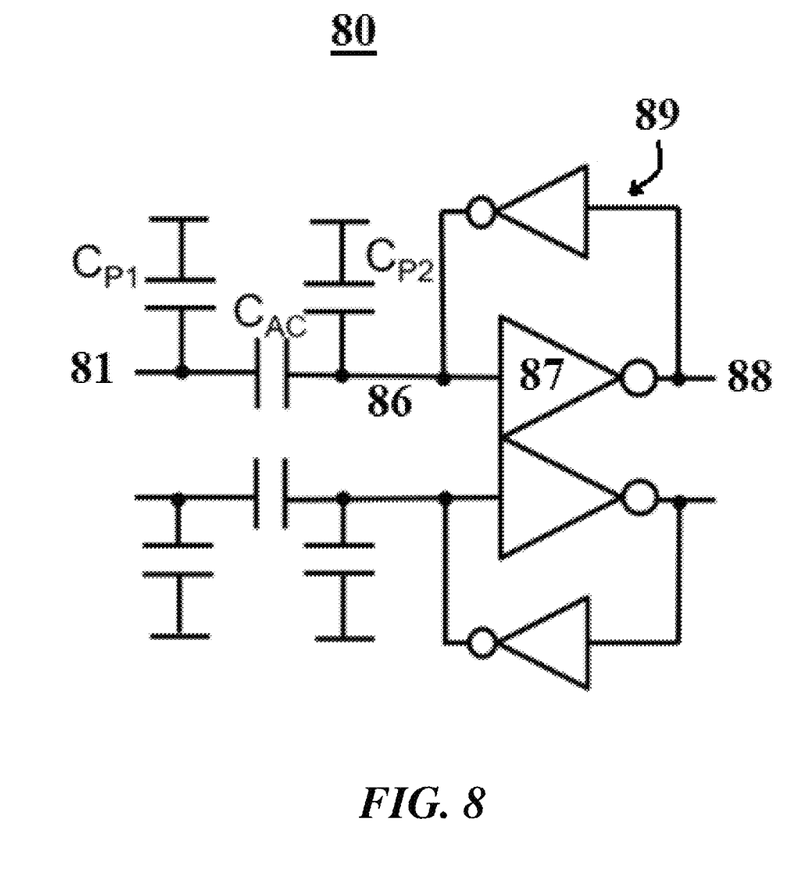
FIG. 8 is a block diagram of one embodiment a high-speed DC-shifting predriver according to the present invention.

FIG. 8 shows a block diagram of one embodiment a high-speed DC-shifting predriver 80 according to the present invention. For purposes of illustration, predriver 80 is shown as a simplified model having a single amplification stage. Other embodiments of the invention are contemplated wherein the amplification may be carried out using a plurality of N stages, as shown in FIG. 2. Also for simplicity of illustration, predriver 80 is modeled with a single input port 81, although in practice it may include a plurality of M input ports to drive an M-bit DAC or TX driver configured for processing M data slices, also as shown in FIG. 2.

The input port 81 may be configured to receive a serial data stream 83. Sources 85 of serial data stream 83 may include a serializer or a retimer, according to preferred implementations of the invention. Serial data stream 83 may be transmitted at any desired data rate; however, simulations have demonstrated that predriver 80 may process data rates up to about 10 GS/s or higher, with high reliability, i.e., low ISI with no or minimal overstress. As used herein, the term overstress means exceeding the rated gate voltage of a device. In one embodiment, predriver 80 can process data rates with high reliability between about 10 GS/s and about 28 GS/s. In another embodiment, predriver 80 can process data rates up to 56 GS/s with similar reliability.

The input port 81 may be coupled to a feedback node 86 through an AC-coupling capacitor $C_{AC}$. In an exemplary embodiment, capacitor $C_{AC}$ may have a capacitance range of about 50 fF to about 150 fF. For certain implementations of the invention, i.e. fabrication of predriver 80 on an integrated circuit and passage of high data rates, parasitic capacitance CP1 and CP2 are modeled as shown. Feedback node 86 is located at the input to an inverting output amplifier 87. In one embodiment, the amplifier 87 may be configured to amplify voltage of an input signal by a magnitude between about 0.5V and 2.0V at the inverted output node 88. In another embodiment, amplifier 87 may be configured to amplify that same voltage by an amount greater than 2.0V.

According to the invention, predriver 80 includes a positive feedback latch 89 coupled between the inverted output node 88 and the feedback node 86. The positive feedback latch 89 is configured so that is has a lower drive strength than the inverting output amplifier 87. The latch functionality helps to ensure that the feedback node 86 is always driven strongly as data is being transmitted. Furthermore, coupling the positive feedback latch 89 in this manner in place of a feedback resistor removes any frequency dependent time constant from the circuit. This has the advantageous effect of minimizing ISI due to random datastreams, as demonstrated below by eye diagram analysis. In a preferred embodiment, positive feedback latch 89 may comprise a weak feedback inverter. As used herein, a "weak" feedback inverter refers to an inverting amplifier in the feedback loop of amplifier 87 that has a lower drive strength than that of amplifier 87. In one embodiment, the weak feedback inverter that serves positive feedback latch 89 may have a similar structure as that of amplifier 87. This configuration for positive feedback ensures that a reliable voltage will occur at the feedback node 86, without causing overstress or reliability concerns.

Figure 9:
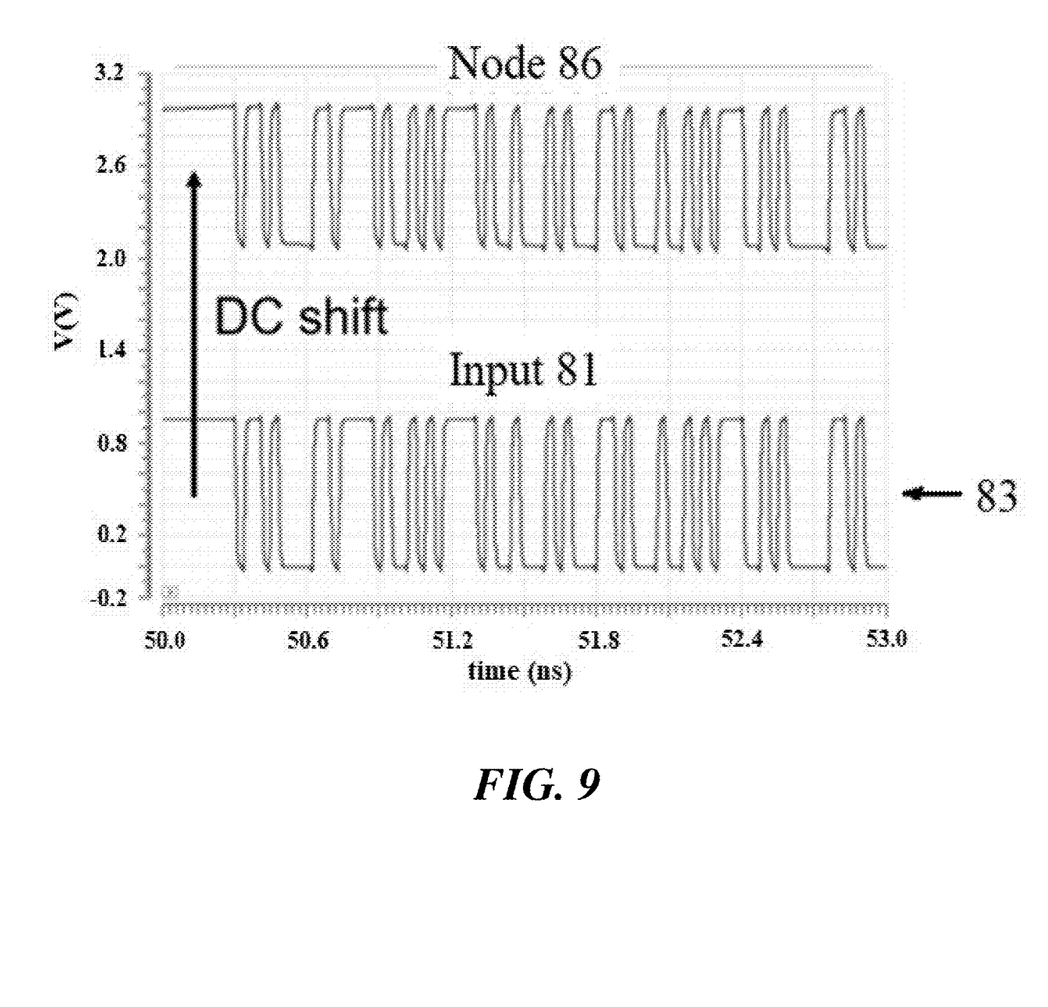
FIG. 9 is a graph of waveforms for input and output voltage in a high-speed DC-shifting predriver according to the present invention.
Figure 10:
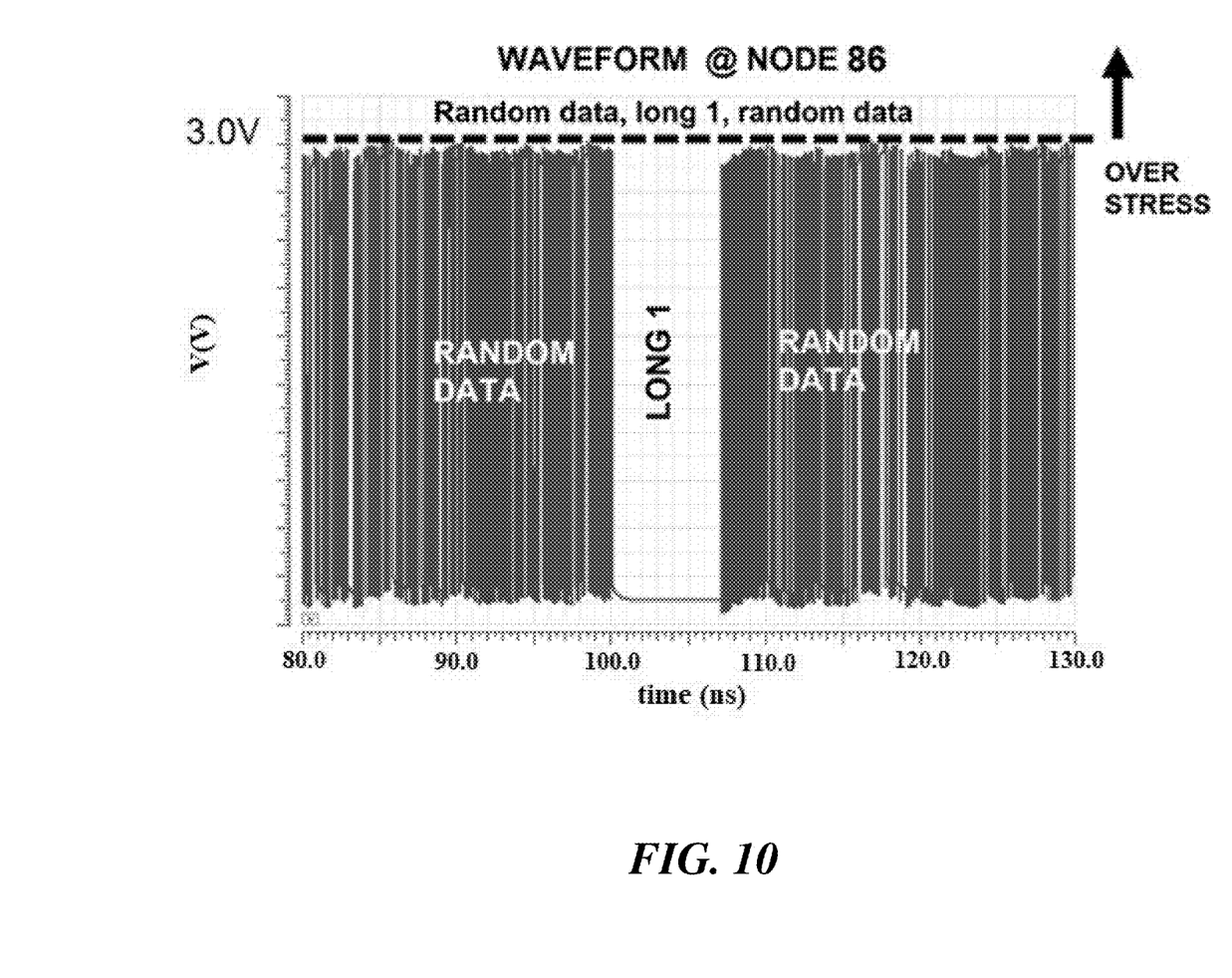
FIG. 10 is a graph showing the voltage waveform at Node A in a high-speed DC-shifting predriver according to one embodiment of the present invention, given input consisting of random data followed by repeating 1's followed by random data.

FIG. 9 shows a graph of waveforms for voltage at input port 81 and for voltage at node 86 in a high-speed DC-shifting predriver according to the present invention. In this exemplary implementation, predriver 80 is configured to provide a DC shift of about 2.0V. The same predriver circuit 80 was subjected to reliability tests using various simulations. In one example, predriver 80 was subjected to a test input data stream consisting of random data, followed by a long stream of binary ones, followed by more random data. The random data was generated as a pseudorandom binary sequence such as defined by the PRBS15 standard. The results are provided in the graph of FIG. 10, which shows the voltage waveform at node 86. A threshold for overstress is shown as the horizontal line at 3.0V. As illustrated in the graph, the positive feedback latch of predriver 80 ensures that feedback node 86 recovers quickly, that there is no substantial overstress, and that |Vgs| and |Vgd| are each consistently kept below 1V.

Figure 11:
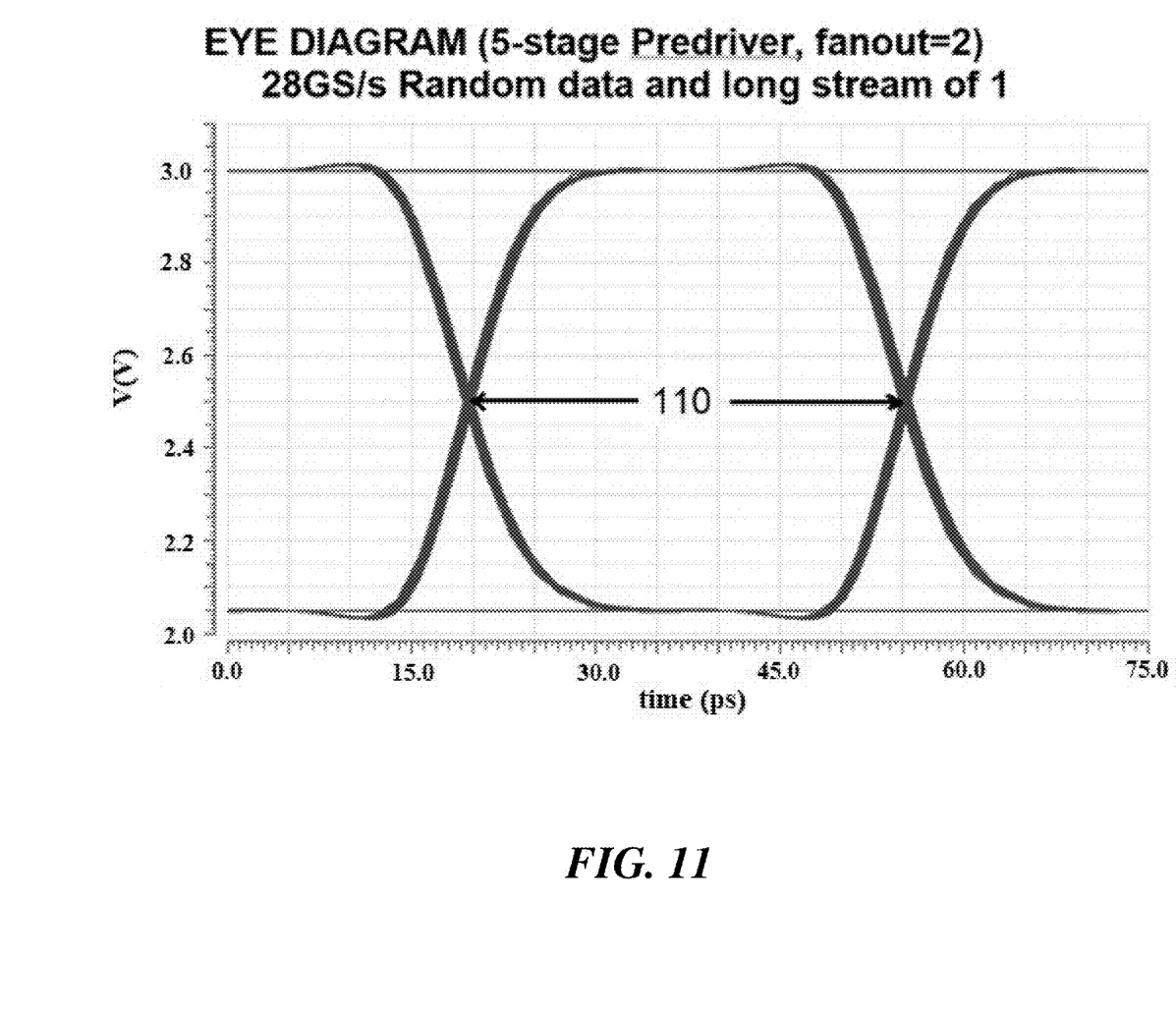
FIG. 11 is an eye diagram showing characteristic ISI curves for an output waveform when random data followed by a long stream of 1's at 28 GS/s as input to one embodiment of a high-speed DC-shifting predriver of the present invention.

FIG. 11 shows an eye diagram of characteristic ISI curves for an output waveform from a predriver 80 according to the invention. The eye diagram results from an input data stream of pseudorandom data followed by a long stream of binary ones at 28 GS/s. In this particular embodiment, the predriver 80 was configured as a 5-stage, 2.0V-shifting predriver with a fanout of 2. By inspection of the eye width 110, it can be seen that the predriver exhibited very good ISI. That is, the eye width 110 is within about 1.75 ps or 5% of Tperiod, where Tperiod is approximately 35.0 ps.

The chart below summarizes the advantages of a predriver according to the present invention over the performance issues inherent in the conventional solution that uses an AC-coupled buffer:

| Issue | AC Coupled Buffer | Predriver 80 |
| --- | --- | --- |
| Area | large resistor required | negligible |
| Reliability | start-up and long 1 pattern show Vgs/Vgd overstress | none |
| Performance | error prone and ISI increases with different data patterns | no degradation due to different patterns |
| Support of lower data rates | increases complexity | no issue |

Figure 12:
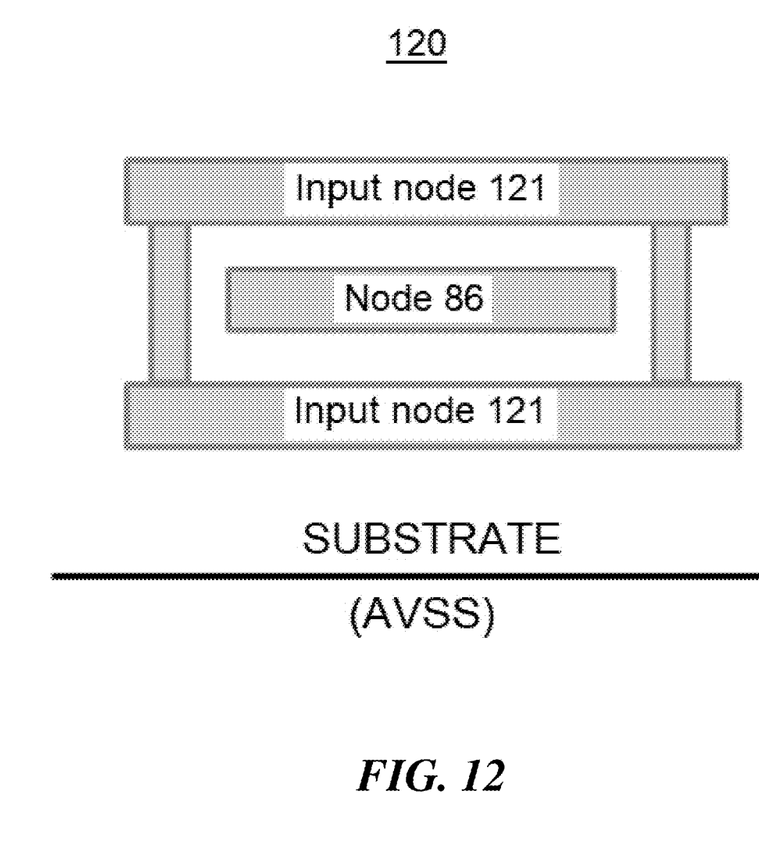
FIG. 12 is a conceptual manufacturing diagram for shielding a Node A within input nodes on a CMOS chip in one embodiment of a high-speed DC-shifting predriver according to the invention.

FIG. 12 shows a conceptual manufacturing diagram for further optimizing a high-speed DC-shifting predriver 120 according to another embodiment of the invention. The diagram provides a cross-sectional view of a layer of semiconductor substrate or CMOS chip fabricated so that the feedback node 86 is shielded on all sides by an input node 121 connected to the predriver input port. Shielding node 86 in this manner minimizes the parasitic capacitance $C_{P2}$. With $C_{P2}$ reduced so that $C_{P2} \ll 1\%$, $C_{P2}$ increases to 10%, as compared to conventional metal-oxide-metal (MoM) capacitors, where CP2/CP1 is about 5%/5%. With the effect of $C_{P2}$ so minimized, the size of $C_{AC}$ is limited by the voltage divider between $C_{AC}$ and the node 86 and by the output capacitance of the much smaller feedback inverter 89.

Figure 13:
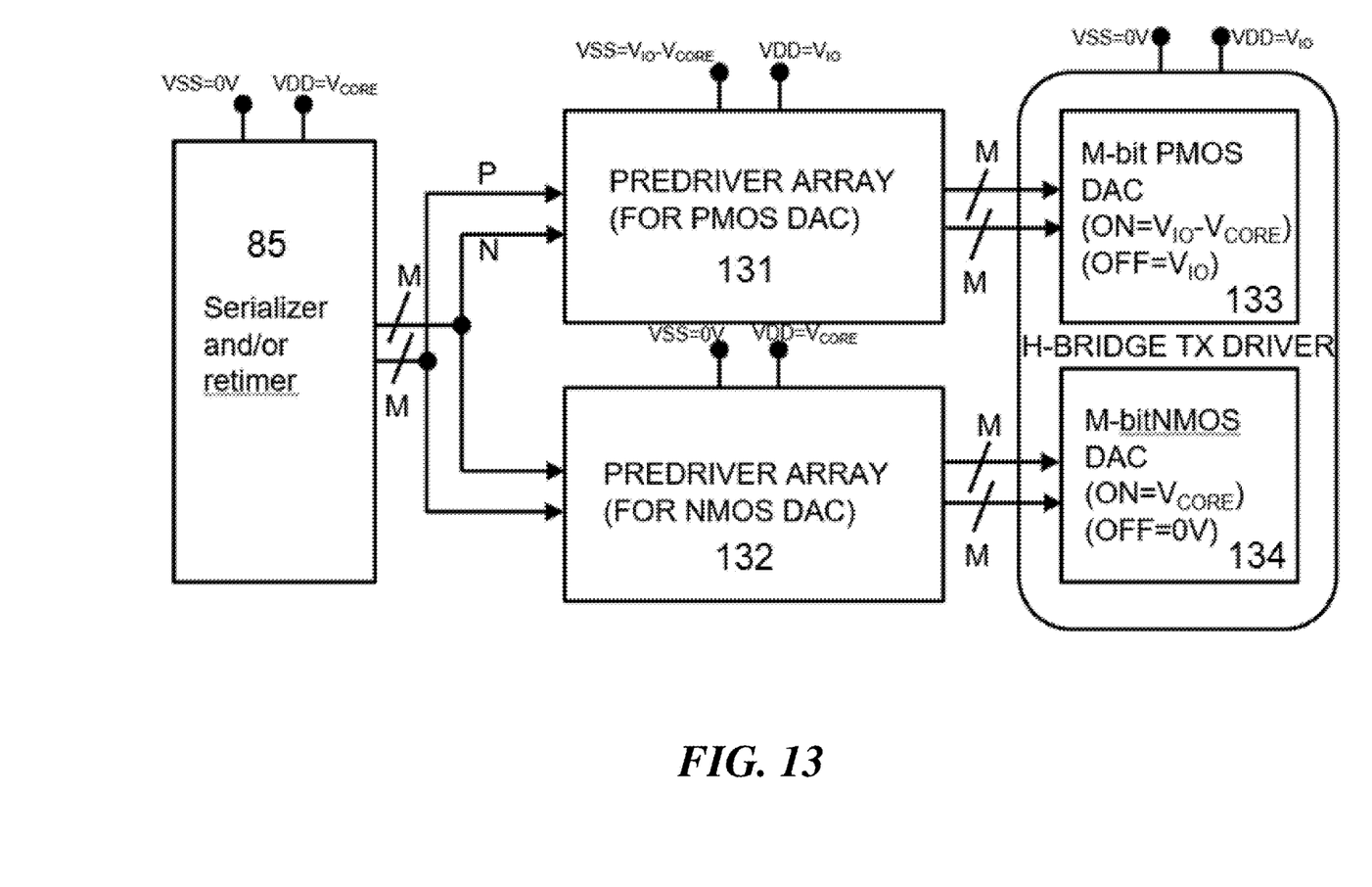
FIG. 13 is a block diagram illustrating one application for a high-speed DC-shifting predriver of the present invention as buffer stage for an H-bridge transmitter DAC driver used for PAM4 signal processing.

FIG. 13 shows a block diagram illustrating one application for a high-speed DC-shifting predriver of the present invention. In this application, the predriver comprises an N-stage predriver array, used as a buffer stage for an H-bridge transmitter DAC driver used for PAM4 signal processing. A first such predriver array 131 is configured for driving an M-bit PMOS DAC 133, and a second such predriver array 132 is configured for driving an M-bit NMOS DAC 134. Both predriver arrays 131 and 132 are identical copies with deep N-wells to use separate predriver VSS from the substrate to GND. Timing is matched by using equally sized PMOS and NMOS DACs 133 and 134 having equal VDD–VSS ($V_{CORE}$) on the two predriver arrays.

Additional information on the form and operation of the H-bridge transmitter DAC driver is provided in co-pending and U.S. Provisional Application 62/854,219 that is fully incorporated herein by reference.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A high-speed DC-shifting predriver, comprising:
an input port configured for coupling to a serial data stream;
at least one inverting output amplifier having a feedback node, and having an output port configured for coupling to a transistor (input to DAC or TX driver);
a capacitor AC-coupled between the input port and the feedback node; and
a positive feedback latch coupled between the output port and the feedback node, the positive feedback latch having a lower drive strength than the inverting output amplifier.

2. The predriver of claim 1 wherein the positive feedback latch comprises a weak feedback inverter.

3. The predriver of claim 2 wherein the weak feedback inverter has structure similar to that of the inverting output amplifier.

4. The predriver of claim 1 wherein the at least one inverting output amplifier is configured to amplify voltage at the input port by an amount greater than 0.5V.

5. The predriver of claim 4 wherein the at least one output amplifier is configured to amplify voltage at the input port to within a range from about [VDDio–VDDcore] to VDDio.

6. The predriver of claim 1 wherein the serial data stream has a data period, and wherein the predriver is configured to reduce intersymbol interference for a pseudorandom binary sequence to below 5% of the data period.

7. The predriver of claim 1 wherein the input port comprises M inputs each coupled to a corresponding one of M bits output from the serial data stream, where M is an integer.

8. The predriver of claim 1 wherein the input port comprises M inputs each coupled to a corresponding one of M bits output from the serial data stream, where M is an integer, and wherein the transistor comprises an input to an M-bit DAC or TX driver.

9. The predriver of claim 8 wherein the at least one inverting output amplifier comprises N amplification stages, where N is an integer.

10. The predriver of claim 1 wherein the at least one inverting output amplifier comprises N amplification stages, where N is an integer.

11. The predriver of claim 1 configured to eliminate substantially all overstress responsive to random data input and/or long 1 input transmitted at data rates up to about 10 GS/s.

12. The predriver of claim 1 fabricated as an integrated circuit.

13. A method, implemented in a DC-shifting transistor predriver for reducing intersymbol interference in a serial data stream transmitted at a high data rate, comprising:
providing an inverting output amplifier having a feedback node, and having an output port configured for coupling to the transistor;
receiving the serial data stream at the feedback node through an AC-coupling capacitor; and
coupling a positive feedback latch between the output port and the feedback node, the positive feedback latch having a lower drive strength than the inverting output amplifier.

14. The method of claim 13 wherein the positive feedback latch comprises a weak feedback inverter.

15. The method of claim 14 wherein the weak feedback inverter has structure similar to that of the inverting output amplifier.

16. The method of claim 13 further comprising amplifying, by the inverting output amplifier, the serial data stream by an amount greater than 0.5V.

17. The method of claim 16 wherein the amplifying step comprises amplifying the serial data stream by an amount from about [VDDio–VDDcore] to VDDio.

18. The method of claim 13 wherein serial data stream has a data period, and wherein the intersymbol interference is less than 5% of the data period.

19. The method of claim 13 wherein the inverting output amplifier comprises N amplification stages, where N is an integer.

20. The method of claim 13 wherein the transistor comprises an input to a DAC or TX driver.

* * * * *